US005610376A

United States Patent [19]

Takagi et al.

[11] Patent Number: 5,610,376

[45] Date of Patent: Mar. 11, 1997

[54] INTERLOCKING STRUCTURE AND DETECTOR FOR SENSING THE POSITION OF AN OPERATING MEMBER IN DETACHABLE ELECTRONIC EQUIPMENT

[75] Inventors: Katsuhiko Takagi; Futoshi Ujiie, both of Iwaki, Japan

[73] Assignee: Alpine Electronics, Inc., Tokyo, Japan

[21] Appl. No.: 403,147

[22] Filed: Mar. 13, 1995

[30] Foreign Application Priority Data

Mar. 14, 1994 [JP] Japan .................................. 6-069000
Nov. 18, 1994 [JP] Japan .................................. 6-309876

[51] Int. Cl.[6] ............................ H01H 9/20; B60R 11/02; E05B 73/00; H05K 5/03

[52] U.S. Cl. ............................ 200/50.01; 70/58; 70/237; 361/679; 361/728; 361/747; 361/814; 455/347

[58] Field of Search ................................ 70/57, 58, 237; 312/7.1, 7.2; 248/27.1–27.3; 361/622, 625, 627, 636, 640, 679, 680, 723–733; 455/344–351; 200/50.01–50.4, 61.58 R

[56] References Cited

U.S. PATENT DOCUMENTS

| | | | |
|---|---|---|---|
| 4,071,722 | 1/1978 | Hart | 200/50 A |
| 4,856,088 | 8/1989 | Oliwa et al. | 455/349 |
| 5,020,151 | 5/1991 | Sampei et al. | 361/725 X |
| 5,111,360 | 5/1992 | Baba | 361/727 |
| 5,152,496 | 10/1992 | Kobayashi | 248/27.1 |
| 5,200,874 | 4/1993 | Ito | 361/622 X |
| 5,210,681 | 5/1993 | Hosoi et al. | 361/729 X |
| 5,216,904 | 6/1993 | Isaki | 70/58 |
| 5,381,684 | 1/1995 | Kawamura | 70/58 |
| 5,510,957 | 4/1996 | Takagi | 361/814 |

*Primary Examiner*—J. R. Scott
*Attorney, Agent, or Firm*—Guy W. Shoup; Patrick T. Bever

[57] ABSTRACT

In a detachable electronic device with a device body which can be detached from a stationary portion and a control unit which can be detached from the device body, the device body is prevented from being released from the stationary portion when the control unit is detached from the device body.

19 Claims, 9 Drawing Sheets

INTERLOCKING STRUCTURE AND DETECTOR FOR SENSING THE POSITION OF AN OPERATING MEMBER IN DETACHABLE ELECTRONIC EQUIPMENT

BACKGROUND OF THE INVENTION

1. Field of the Invention

This invention generally relates to an electronic device such as a vehicle-mounted radio, compact disk player or cassette player, in which the device body is detachable from a stationary portion of the device, and a control unit is detachable from the device body. More particularly, this invention relates to a detachable electronic device in which the device body can not be detached from the stationary portion when the control unit is removed from the device body.

2. Description of the Prior Art

FIG. 13 is a partial side view of a conventional detachable electronic device.

A frame-shaped stationary portion 1, typically made of a metal plate, is embedded in a console panel (typically the dashboard of an automobile). A device body 2 consists of a casing 3 and a nose portion 4 fixed in front of the casing 3. A control unit 13 is detachably mounted on the front of the nose portion 4. On the front of control unit 13 is an operating panel 13*a* on which various operating buttons and a liquid crystal panel are typically provided. Further, a lock mechanism for locking the attached control unit 13 is provided between the control unit 13 and the nose portion 4. A lock release button 13*e* is provided on the operating panel 13*a*. When the lock release button 13*e* is pushed, the control unit 13 is released from the nose portion 4 and the control unit 13 can be taken out of the nose portion 4.

A support shaft 5*b* is provided on each of the left and right sides of the nose portion 4. A handle 5 is pivotally supported by the support shaft 5*b*. During device operation, the handle 5 is in the position indicated by the solid lines in FIG. 13 and extends along the sides and bottom surface of the nose portion 4. Furthermore, the handle 5 can be pivotally moved to a position indicated by the broken lines in FIG. 13 to extend in front of the nose portion 4.

A lock arm 6 is pivotally and movably fastened to the handle 5 with a pin 7. A guide pin 8 is fixed on the side surface of the casing 3. The guide pin 8 slides along a guide groove 6*b* formed in the lock arm 6. Thus, the lock arm 6 is adapted to move with the handle 5 as the handle 5 moves pivotally. A lock projection portion 6*a* is formed at an end of the lock arm 6 and a lock hole 1*a* is formed in the stationary portion 1.

When the device body 2 is inserted into the stationary portion 1 and the handle 5 is rotated to the position indicated by solid lines (i.e., the down position) the lock projection portion 6*a*, formed at the end of the lock arm 6, is fitted into the lock hole 1*a* of the stationary portion 1 and the device body 2 is locked and removably fixed to the stationary portion 1.

A push button 9 for moving the handle 5 into the extended position is provided on an upper part of the front of the nose portion 4. If the button 9 is pushed when the handle 5 is in the down or operating position (as indicated by the solid lines in FIG. 13), a pivot force plate 9*a* provided in the inside of the nose portion 4 is pivotally moved counterclockwise so that the handle 5 is pivotally moved counterclockwise to the extended position (shown by broken lines in FIG. 13) where the handle 5 protrudes from the nose portion and is easy to grasp. When the handle 5 is pivotally moved counterclockwise, the lock projection portion 6*a* moves out of the lock hole 1*a* and the device body 2 is released from the stationary portion 1. When the handle 5 is pivotally moved to the extended position, device body 2 is pulled out of the stationary portion 1 by the handle 5 in the direction of arrow A in FIG. 13.

With the above described vehicle-mounted audio device, when the device body 2 is pulled out of the stationary portion 1 and removed, the device body 2 can be stored safe from theft and damage while the vehicle is parked. Further, when the vehicle is parked for a short time, it is possible to detach only the control unit 13 from the nose portion 4 and carry the control unit 13 away from the vehicle. As a result of detaching the control unit 13, electronic circuits and various mechanisms provided in the device body 2 become inoperable, i.e., the operation of the device body 2 can not be controlled when the operating member 13 is detached, and there is limited use for only the device body 2. Consequently, a theft of the device body 2 from the vehicle can be discouraged.

However, even when the control unit 13 is removed, if the handle 5 is pivotally moved to the extended position, the device body 2 can still be removed from the stationary portion 1. Therefore, there is still a possibility that even when the control unit 13 is carried outside of the vehicle, the device body 2 may be stolen from the vehicle.

SUMMARY OF THE INVENTION

In accordance with the present invention, the problems discussed above are solved by providing a detachable electronic device which prevents the removal of the device body when the control unit is detached so as to prevent the device body from being removed from the stationary portion.

In one embodiment of the present invention a detachable electronic device includes: a device body detachably attached to a stationary portion; a control unit detachably attached to the device body; a lock mechanism for preventing the device body from being removed from the stationary portion when the control unit is detached; a lock release mechanism for releasing the device body from the stationary portion; and a detection mechanism for sensing when the control unit is attached to the device body. According to the invention, when the detection mechanism senses that the control unit is attached to the device body, the lock release mechanism is permitted to release the device body.

In another embodiment of the invention, a restraining assembly is provided. For example, in one embodiment of the invention, the lock mechanism is a retaining surface engaged with a stop projection on the stationary portion and the lock release mechanism is a handle adapted to pivotally move between a first position, where the handle extends in front of the device body and the device body can be detached, and a second position where the handle is in a down position and the device body cannot be detached from the stationary portion. The handle in this embodiment is adapted to release the retaining surface from the stop projection when the handle is pivotally moved to the first position. In this embodiment, the detection mechanism includes a detection projection which is contacted by the control unit when the control unit is attached to the device body. The restraining assembly operates to restrain the handle from pivotally moving to the first position and thereby prevents the device body from being detached from the stationary portion. When the detection projection is contacted by the control unit, the restriction imposed by the restraining assembly on the handle is canceled.

Further, according to one embodiment of the invention, a recessed portion is provided in a front portion of the device body and the detection projection is provided in the recessed portion. In this embodiment, when the control unit is detachably attached to the recessed portion, the detection projection is contacted and causes the restraining assembly to release the locking mechanism.

Furthermore, according to the invention, the detection projection may be resiliently positioned in the recessed portion.

In another embodiment of the invention, a push button and restraining assembly are provided and the lock mechanism is a retaining surface engaging the stationary portion. In this embodiment of the invention, the lock release mechanism is once again a handle adapted to pivotally move between a first position, where the handle extends in a first direction and the device body can be taken out, and a second position, where the handle extends in a second direction perpendicular to the first direction. In this embodiment, the push button operates to pivotally move the handle through a predetermined angle to the first position and the restraining assembly operates to prevent the push button from being pushed. In this embodiment, when the detection projection is contacted by the control unit, the restriction imposed by the restraining assembly on the push button is canceled. In this case, the restraining assembly includes a plate spring. Further, the detection projection may be provided on the plate spring. In this embodiment, when the detection projection is pushed, the plate spring elastically deforms and releases the restriction imposed on the push button.

In another embodiment of the invention, the lock mechanism is also a retaining surface engaging the stationary portion and the lock release mechanism is an electric power source for releasing the retaining surface from the stationary portion. The detection mechanism in this embodiment is also a detection projection which is contacted by the control unit when the control unit is attached to the device body. An operating body can be provided in the control unit which is activated when the detection projection senses that the control unit is attached to the device body. In this event, the electric power source operates to release the retaining surface from the stationary portion electrically.

In one embodiment, the electric power source may be a solenoid. Further, the electric detection mechanism may constitute an electric switch. In this case, the state of the electric switch is monitored by a control portion coupled to the detection mechanism and when the state of the electric switch indicates the control unit is attached, the control portion drives the solenoid to release the lock mechanism.

Alternatively, a plurality of connectors provided between the device body and the control unit may be used as the detection mechanism.

In yet another embodiment of the invention a detachable electronic device includes: a device body detachably attached to a stationary portion; a control unit detachably attached to the device body; a lock mechanism for preventing the device body from being removed from the stationary portion; a lock release mechanism for releasing the device body from the stationary portion; and a detection mechanism for sensing that the control unit is attached to the device body.

In this embodiment, a recessed portion is provided in a front portion of the device body and the detection mechanism is provided in the recessed portion. Further, when the control unit is detachably attached to the recessed portion, the detection mechanism is operated.

In this embodiment, the lock mechanism may be, for example, a retaining lever which engages the stationary portion. Further, the detection mechanism may be a detection projection which is contacted by the control unit when the control unit is attached to the device body. In this embodiment, when the detection projection is pushed, the retaining lever is operated in a direction so that the retaining lever is released from the stationary portion.

In this case, the retaining lever may be an integral part of the detection projection.

In this embodiment, the detection mechanism may also electrically sense that the control unit is attached to the device body and an electric power source may be provided as the lock release means for releasing the retaining lever from the stationary portion and, when the detection projection senses that the control unit is attached to the device body, the retaining lever is released from the stationary portion by the electric power source.

Additionally, a plurality connectors provided between the device body and the control unit may be used as the detection mechanism in this embodiment as well.

According to the invention, the device body is locked to the stationary portion by the lock mechanism and when the control unit is detached from the device body, the lock release mechanism is inhibited from operating. Therefore, when the control unit is detached from the device body, the device body cannot be detached from the stationary portion. Consequently, the device body is prevented from being stolen. Moreover, when the control unit is attached to the device body, the lock release mechanism is able to perform a lock release operation. Thus, the device body, to which the control unit is attached, can be detached from the stationary portion and the detached device body can be kept separately from the stationary portion.

BRIEF DESCRIPTION OF THE DRAWINGS

Other features and advantages of the present invention will become apparent from the following description of the invention with reference to the drawings. In the following drawings like reference characters designate like or corresponding parts.

DETAILED DESCRIPTION OF THE PREFERRED EMBODIMENTS

Figure 1:
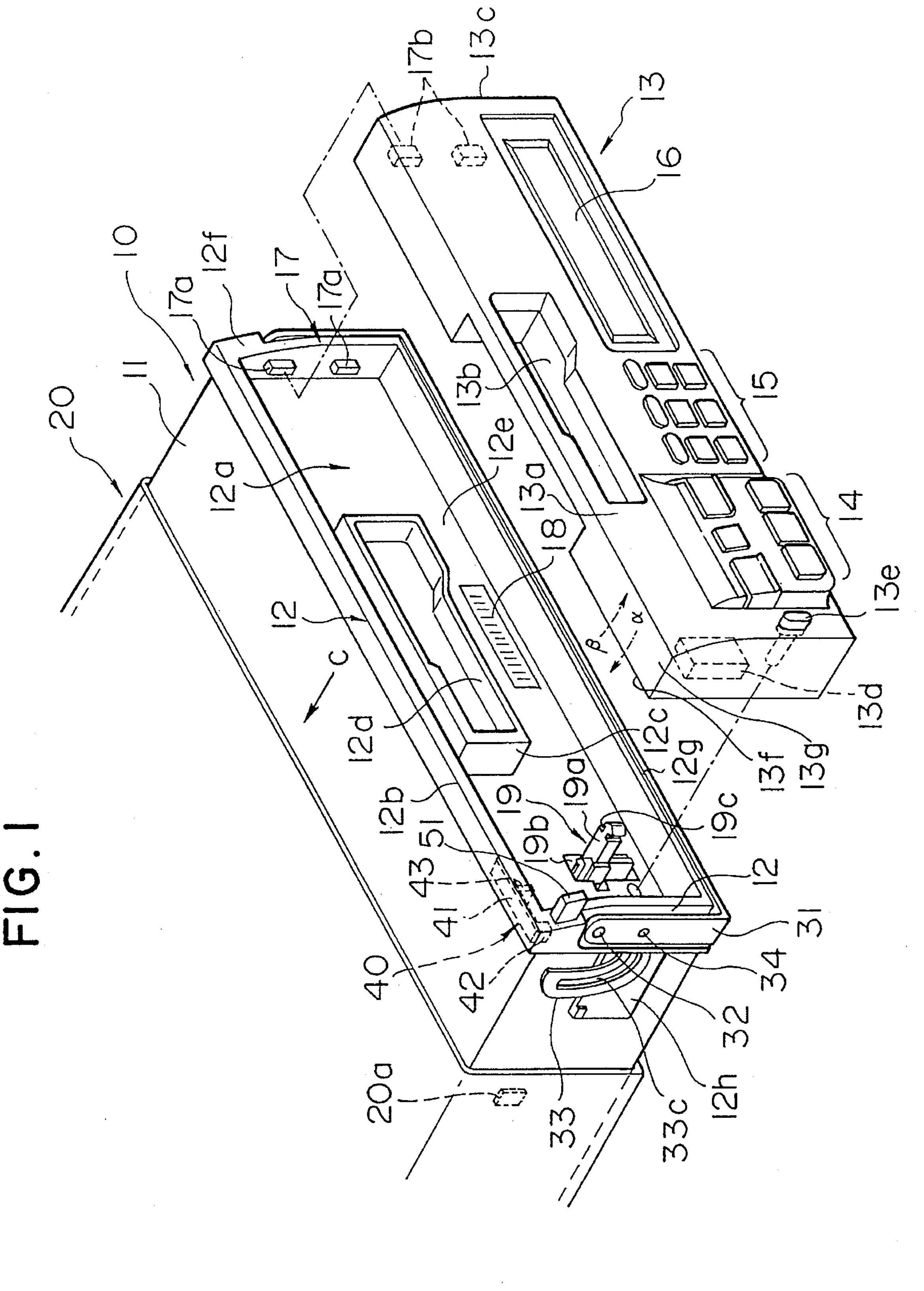
FIG. 1 is a perspective view of a detachable vehicle-mounted audio device in accordance with a first embodiment of the invention.
Figure 2:
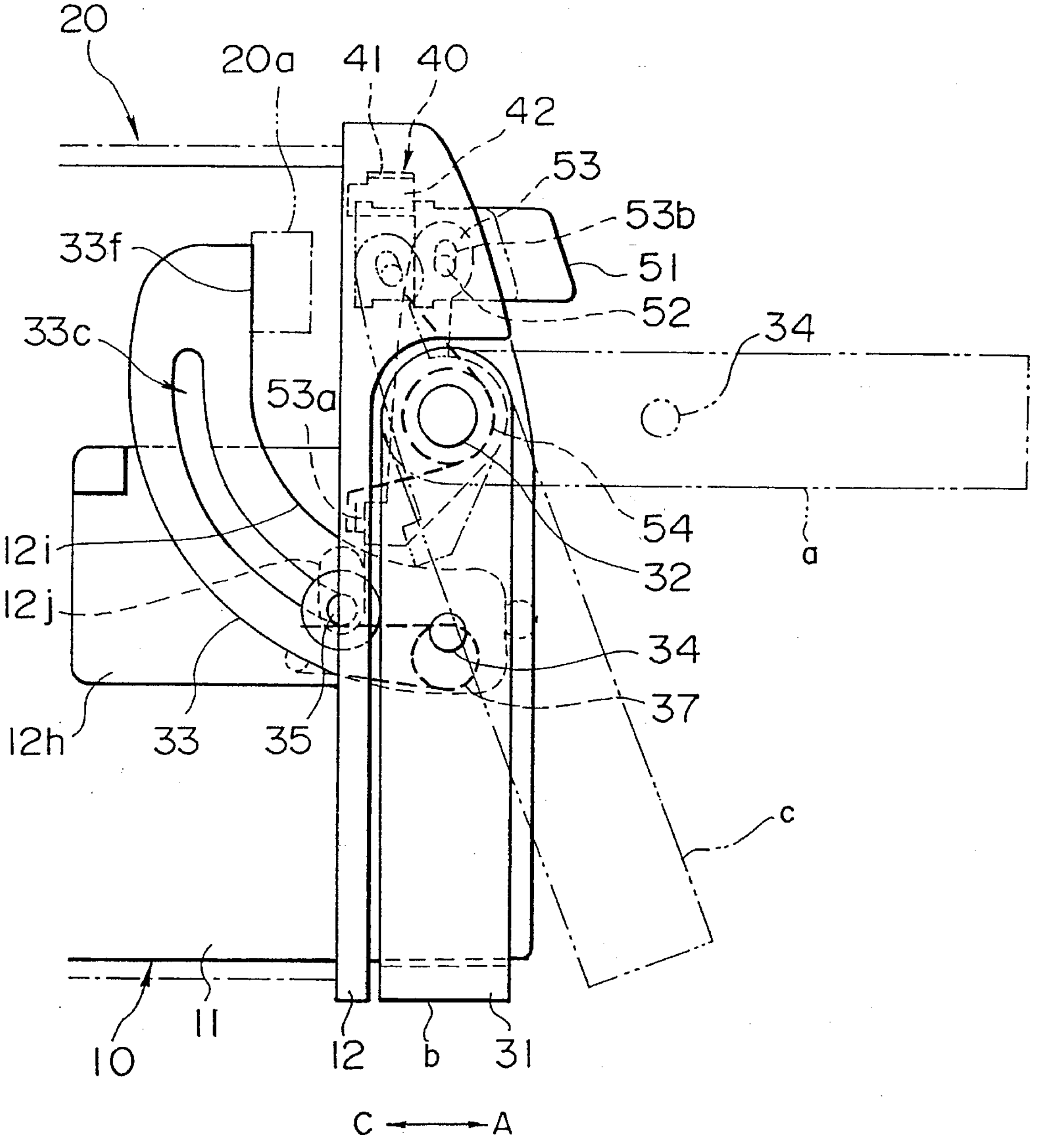
FIG. 2 is a partial side view of the detachable vehicle-mounted audio device of FIG. 1.
Figure 3:
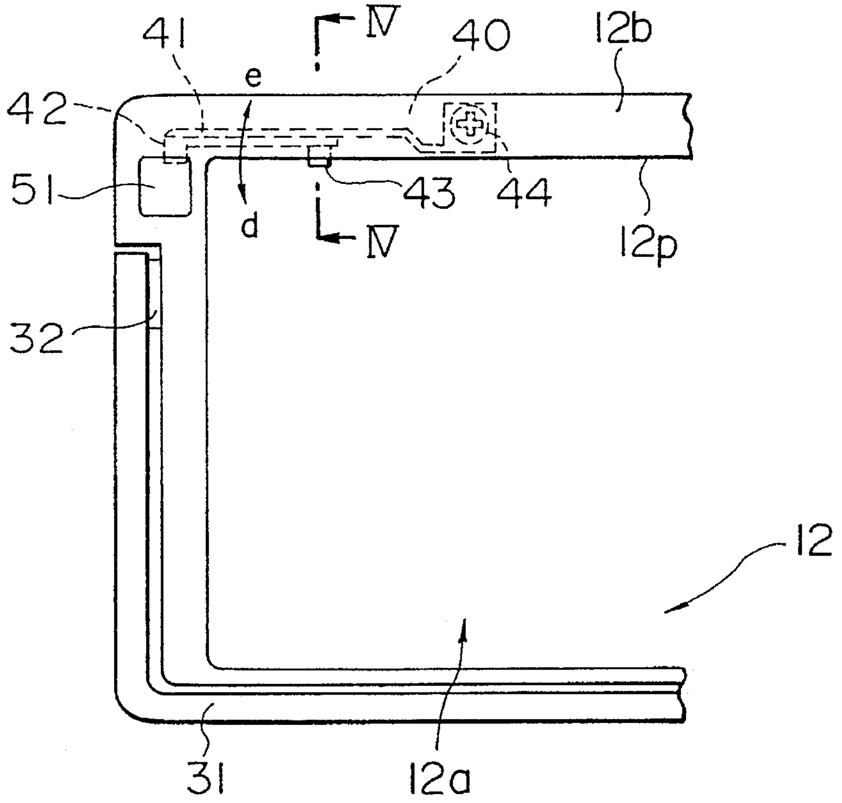
FIG. 3 is a partial front view of a part of a nose portion and restraining means of the device of FIG. 1.
Figure 4:
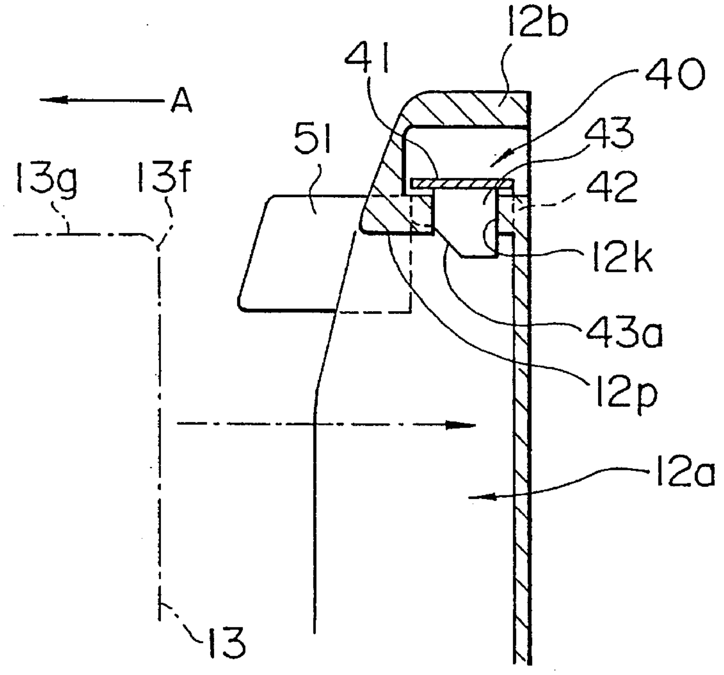
FIG. 4 is an enlarged sectional view taken on line IV—IV of FIG. 3.

FIG. 1 is a perspective view of a detachable vehicle-mounted audio device according to a first embodiment of the invention. FIG. 2 is a partial side view of the detachable vehicle-mounted audio device of FIG. 1. FIG. 3 is a partial front view of a nose portion of the detachable vehicle-mounted audio device of FIG. 1. FIG. 4 is an enlarged sectional view taken on line IV—IV of FIG. 3.

FIGS. 1–4 include a stationary portion 20. Stationary portion 20 is made of metal and is shaped like a frame or a box. Stationary portion 20 is embedded and fixed in what is called a console panel (typically a vehicle dashboard). The device body 10 of the vehicle-mounted audio device is adapted for insertion or removal from stationary portion 20.

At the front of the device body 10, a nose portion 12, which is typically plastic, is mounted to the front of a metallic chassis 11. A control unit 13 is detachably mounted in a front recessed portion 12*a* of the nose portion 12. In this embodiment, the chassis 11 and the nose portion 12 constitute the device body 10.

In the recessed portion 12*a* of the nose portion 12, a rectangular insertion frame 12*c* protrudes from the bottom surface 12*e*. Insertion frame 12*c* includes an insertion path 12*d* through which a cassette tape is inserted.

The front surface of the control unit 13 includes an operation panel 13*a* on which various operating buttons 14 and 15 are located. Further, a display device 16, such as a liquid crystal panel, is provided on the operation panel 13*a*. An insertion port 13*b* is formed through the control unit 13. When the control unit 13 is attached to the recessed portion 12*a* of the nose portion 12, the inner surface of the insertion port 13*b* lines up with the inner surface of the insertion path 12*d*. A cassette tape is loaded into a cassette tape driving mechanism (not shown) provided in the chassis 11 from the insertion port 13*b* in the control unit 13 through the insertion path 12*d*. Those of skill in the art will recognize that insertion port 13*b* and insertion path 12*d* can also be formed to accept compact disks or mini-disks. Therefore, the invention is equally applicable to audio devices used with these media.

A pin connector 18 is provided on the bottom surface 12*e* of the recessed portion 12*a* of the nose portion 12. When the control unit 13 is fitted into the recessed portion 12*a* of the nose portion 12, a switching device to be activated by the operating buttons 14 and 15 provided in the control unit 13 is electrically connected with the inner circuitry of the chassis 11 through pin connector 18.

Convex and concave portions of a retaining device are provided in the right-hand portion of the nose portion 12 and the right-side portion 13*c* of the control unit 13, respectively, as illustrated in FIG. 1. The retaining mechanism 17 consists of a pair of retaining projections 17*a* which protrude from the nose portion 12 and a pair of retaining recesses 17*b* formed in the right-side 13*c* of the control unit 13. The retaining projections 17*a* are attached to the retaining recess portions 17*b*, as indicated by broken lines in FIG. 1, so that the right-hand part of the control unit 13 is detachable to the nose portion 12.

A fixing or lock mechanism 19 is provided on the left-hand side, as viewed in FIG. 1, of the bottom surface 12*e* of the recessed portion 12*a* of the nose portion 12. The control unit 13 is fitted to the nose portion 12 by means of the retaining mechanism 17 and is pivotally moved in the direction of arrow $\alpha$, until control unit 13 contacts a fixing or lock pawl 19*b* of lock mechanism 19. Then control unit 13 is attached to lock mechanism 19 with a fixing or locking portion 13*d* provided on the back surface of the control unit 13. In this manner, the control unit 13 is locked to the nose portion 12.

A lock release button 13*e* for releasing the fixed or locked state of the control unit 13 is provided on the operation panel 13*a* of the control unit 13. When the lock release button 13*a* is pressed while the control unit 13 is fixed or locked in the recessed portion 12*a* of the nose portion 12, the lock pawl 19*b* is released from the locked portion 13*d*. Then, a part of the lock mechanism 19, namely, a retaining member 19*a* is extended in front of the nose portion 12 and the control unit 13 is pivotally moved in the direction of arrow $\beta$ by a predetermined angle about the retaining mechanism 17 which serves as a fulcrum. Thus, control unit 13 is temporarily held by a pawl 19*c* provided at a leading end of the retaining member 19*a* and the control unit 13 can be easily grasped. When the control unit 13 is grasped and pulled, the control unit 13 is released from the pawl 19*c*. Consequently, the control unit 13 can be detached from the nose portion 12.

A handle 31 is pivotally mounted on support shafts 32 fixed to both side surfaces 12*f* of the nose portion 12 of the device body 10. The handle 31 is typically made of a resin (plastic) material and is shaped like a letter "C". In this embodiment, the handle 31 functions as lock release for releasing the locked device body 10 from the stationary portion 20.

The handle 31 is adapted to be pivotally moved between a first position (indicated by (a) in FIG. 2), where the handle 31 extends in front of the nose portion 12 in the direction of an arrow A (see FIG. 2) which is also the direction the device body 10 is pulled out of stationary portion 20, and a second position (indicated by (b) in FIG. 2) which is the device operating position. When being pivoted to the second or down position, the handle 31 surrounds the leading end of the device body 10, i.e., the handle 31 abuts the left and right side surfaces 12*f* and the bottom surface 12*g* of the peripheral frame of the nose portion 12 as illustrated in FIG. 1.

A lock arm 33 is pivotally coupled to the inner surface of the left side of the handle 31 through a connecting shaft 34. The lock arm 33 is curved and has an arcing elongated slot 33*c* formed therein. A support piece 12*h* to be positioned on the outside of the side of the chassis 11 is formed on the rear end surface of the nose portion 12. An biased guide pin 35 is inserted by means of the supporting piece 12*h* into an elongated hole 12*j* which is formed to extend obliquely as viewed in FIG. 2. The biased guide pin 35 is biased in an upward direction by a torsion spring 37. Owing to the fact that the biased guide pin 35 is inserted into the elongated slot 33*c* and that the pressure of the torsion spring 37 is applied to the lock arm 33, the lock arm 33 is pushed against a sliding step 12*i* formed on the supporting piece 12*h*. Thus, a sliding force is imposed on the lock arm 33.

On the other hand, a stop projection 20*a* is provided on the inner surface of the side panel of the stationary portion 20. The stop projection 20*a* is formed by, for instance, cutting and bending a portion of the metallic side panel of the stationary portion 20 inward (See FIG. 1). When the device body 10 is inserted into the stationary portion 20 and the handle 31 is moved to the second or down position (b) (See FIG. 2), the lock arm 33 is pivotally moved into the stationary portion 20 and a retaining surface 33*f* provided at a tip end of the lock arm 33 is held against the stop projection 20*a*. Thus, the device body 10 is prevented from being pulled out of the stationary portion 20 in the direction of the arrow A (see FIG. 2). In this embodiment, the retaining surface 33*f* of the lock arm 33 serves as lock means for locking the device body 10 in the stationary portion 20. Further, the retaining surface 33*f* of the lock arm 33 and the retaining projection 20*a* constitute a lock mechanism.

As shown in FIGS. 1 and 2, a push button 51 is provided on the left-hand portion of the nose portion 12. As shown in FIG. 2, the push button 51 is supported so as to move back into to the nose portion 12 in the direction of arrow C when pushed. A pin 52 is fixed to the push button 51 and is inserted in an elongated hole 53*b* of a bias plate 53 which is pivotally supported on a support shaft 32. An energizing member 53*a* provided at the lower end of the bias plate 53 faces the edge portion of the handle 31 on the side of the stationary portion 20. The bias plate 53 is urged clockwise by a torsion spring 54 at all times. Thus, the push button 51 is always biased in the direction A and protrudes from the nose portion 12.

As illustrated in FIGS. 3 and 4, a restraining assembly 40 is enclosed in the peripheral frame 12*b* provided at the upper part of the nose portion 12. A plate spring 41 serving a spring member is provided in the restraining assembly 40. The base end of the plate spring 41 (namely, the right end thereof as viewed in FIG. 3) is fixed through a securing member 44 such as a screw or a weld in the frame 12*b* provided at the upper part of the nose portion 12. A restraining member 42 is fixed at an end portion of the plate spring 41 (namely, a left end portion thereof as viewed in FIG. 3) and is biased or pressed by the plate spring 41 in the direction of an arrow (d). When the push button 51 protrudes in the direction of arrow A (see FIG. 2), the restraining member 42 is pressed in the direction of the arrow (d) and is caught by the rear end of the push button 51. Thus, the push button 51 is prevented from being pressed in the direction of the arrow C (See FIG. 2).

A detection projection 43 serves as detection mechanism for detecting the insertion of the control unit 13. Detection projection 43 is positioned on the right side of the restraining member 42 of the restraining assembly 40. The detection projection 43 is formed to be integral with the restraining member 42 and is made of resin (plastic) or the like. Alternatively, the detection projection 43 may be fixed to the plate spring 41 separately from the restraining member 42. As illustrated in FIG. 4, a hole 12*k* is formed in a bottom surface section 12*p* of the peripheral frame 12*b* provided at the upper part of the nose portion 12, in a section facing the recessed portion 12*a* of the nose portion 12. The detection projection 43 extends through this hole 12*k* and juts into the recessed portion 12*a*. An incline portion 43*a* is formed on a part of the detection projection 43 facing the direction of the arrow A (See FIG. 4). When the control unit 13 is attached to the device body 10, the bottom surface 12*p* of the peripheral frame 12*b* provided at the upper part of the nose portion 12 becomes a part of the peripheral inner surface of the recessed portion 12*a* of the device body 10, to which the control unit 13 is attached. In other words, when the control unit 13 is attached to the device body 10, the bottom surface 12*p* faces an outer surface of the device body 10 intersecting with the direction of the insertion of the device body 10.

The operation of the detachable vehicle-mounted audio device discussed above will now be described.

When the control unit 13 is attached to the device body 10, the retaining projections 17*a* are fitted into the retaining recess portions 17*b* as illustrated in FIG. 1. Then, the control unit 13 is pivotally moved in the direction of arrow α around the fitted part of the retaining mechanism 17, which serves as a fulcrum. Thus, the control unit 13 is inserted into the recessed portion 12*a* formed in the nose portion 12 of the device body 10 and the fixing or lock pawl 19*b* of the fixing or lock mechanism 19 is engaged with the fixed or locked portion 13*d* of the control unit 13. Consequently, the control unit 13 is detachable locked to the nose portion 12 of the device body 10.

When the device body 10 is detached from the stationary portion 20, the handle 31 serves as a lock release and is pivotally moved to the extended position (position (a) in FIG. 2), in the direction of the arrow A and the lock arm 33 is moved to the right, as viewed in FIG. 2, by being pulled through the connecting shaft 34.

In contrast, after the chassis 11 of the device body 10 is inserted into the stationary portion 20 in the direction of the arrow C, the handle 31 is pivotally moved to the down position (position (b) in FIG. 2). As shown in FIG. 1, when the handle 31 is completely moved to the down position, the handle 31 fits along the side surfaces 12*f* and the bottom surface 12*g* of the nose portion 12. When handle 31 is in the down position the lock arm 33 is pivotally moved to the position illustrated by solid lines in FIG. 2 while the force due to the biased guide pin 35 is applied to the handle 31. Thus, the retaining surface 33*f* abuts against the stop projection 20*a*. Consequently, the device body 10 is locked into the stationary portion 20 and cannot be taken out of the stationary portion 20 in the direction of the arrow A.

If the lock release button 13*e* provided on the operation panel 13*a* of the control unit 13 is pushed while the device body 10 is inserted in the stationary portion 20 and is locked by means of the retaining surface 33*f* and the stop projection portion 20*a*, the engagement between the fixing or lock pawl 19*b* of the fixing or lock mechanism 19 and the fixed or locked part 13*d* provided on the back surface of the control unit 13 is released. Consequently, the fixed or locked state of the control unit 13 is released. At that time, a part of the fixing or lock mechanism 19, namely, the retaining member 19*a* is protruded in front of the nose portion 12 by the force of a spring (not shown). Then, the fixed or locked portion 13*d* of the control unit 13 remains engaged with the pawl 19*c* of the retaining member 19*a* and the control unit 13 is temporarily held in position after having been pivoted a predetermined angle around the right-hand retaining mechanism 17 in the direction of arrow β (see FIG. 1).

When the control unit 13 is grasped and pulled, the engagement between the fixed or locked portion 13*d* and the pawl 19*c* of the projection retaining member 19*a* is released. Consequently, the control unit 13 can be detached from the nose portion 12 completely. For a detailed description of the locking and retaining mechanism described above, see the commonly assigned application entitled "LOCKING AND RETAINING MECHANISM FOR AN ELECTRONIC DEVICE HAVING A DETACHABLE CONTROL UNIT", Ser. No. 401,587, filed Mar. 9, 1995, now U.S. Pat. No. 5,510,957, which is incorporated herein by reference.

When the control unit 13 is pulled out of the recessed portion 12*a* of the nose portion 12, the detection projection 43 of FIG. 3 extends into the recessed portion 12*a* of the nose portion 12 by the force of the plate spring 41. Further, the restraining member 42 is urged or pressed in the direction of the arrow d and is caught by the rear surface of the push button 51. As a result, the push button 51 cannot be pushed in the direction of the arrow C (see FIGS. 2 and 3). Thus, the bias plate 53 of FIG. 2 is moved pivotally clockwise by the torsion spring 54, so that the energizing member 53*a* provided at the bottom of the tension plate 53 prevents the handle 31 from being pushed out in the direction of the arrow A.

As depicted in FIG. 1, during device operation, the handle 31 is folded to the down position (position (b)) to surround the left and right side surfaces 12*f* and the bottom surface 12*g* of the peripheral frame of the nose portion 12 (i.e., handle 31 is in the operating position). The stationary portion 20 and the chassis 11 are embedded in what is called the console panel, namely, the dashboard of the vehicle. Moreover, the front of the nose portion 12 and the surface of the console panel (or dashboard) of the vehicle are nearly in a same plane (not shown). Thus, when the handle 31 is in the down position of FIG. 1 (position (b)), the handle 31 is positioned inside of the console panel (or dashboard) and is difficult to clasp. Therefore, it is difficult to pull out the handle 31. Further, as described above, bias plate 53 prevents the handle 31 from pivotally moving in the direction of arrow A (See FIG. 2). Consequently, it becomes very difficult to pivotally move the handle 31 to the extended position (position (a) in FIG. 2) by hand and it is therefore very difficult to detach or remove the device body 10 from the stationary portion 20.

Thus, when the control unit 13 is detached from the device body 10, the restraining assembly 40 prevents the push button 51 from being pushed and the handle 31 can not be moved. Moreover, the engagement between the retaining surface 33*f* and the stop projection 20*a* can not be disengaged. Consequently, the device body 10 is locked in and cannot be pulled out of the stationary portion 20.

Next, if the control unit 13 is inserted into the recessed portion 12*a* of the nose portion 12 when the device body 10 is locked to the stationary portion 20, an upper edge portion 13*f* (See FIG. 1) of the rear surface of the control unit 13 is held against the incline portion 43*a* (See FIG. 4) of the detection projection 43 protruding from the bottom surface 12*p* of the peripheral frame 12*b* of the nose portion 12. If the control unit 13 is fitted into the recessed portion 12*a* of the nose portion 12 in this manner, the detection projection 43 is pushed up in the direction of arrow (e) as illustrated in FIG. 3. Further, the plate spring 41 is also pushed up in direction (e). Then, when the control unit 13 is completely fitted into the recessed portion 12*a* of the nose portion 12, the restraining member 42, supported by the plate spring 41, moves away from the rear end of the push button 51, in the upward direction in FIG. 3. As a result, the push button 51 is able to be pushed in the direction of the arrow C.

When the push button 51 is pushed in the direction of the arrow C, the bias plate 53 is moved pivotally and counterclockwise. Further, an edge portion of the handle 31, which lies on the side of the stationary portion 20, is pushed in the direction of the arrow A (See FIG. 2) by the energizing member 53*a* provided at the bottom end of the tension plate 53. Thus, the handle 31 is pivotally moved a predetermined angle to a position indicated by a character (c) in FIG. 2. As a result of pushing the push button 51, the handle 31 is able to pivotally move to a position in front of the nose portion 12, where the handle 31 can be easily grasped. Incidentally, when the push button 51 is released, the bias plate 53 is pivotally moved clockwise by the elastic force of the torsion spring 54 and the push button 51 returns to a protruded state.

Once the handle 31 has been pivotally moved to the position (c) it is grasped and is pivotally moved to the position (a) and the lock arm 33 connected to the handle 31 is pivotally moved about the connecting shaft 34 counterclockwise as illustrated in FIG. 2. Then, the retaining surface 33*f* provided at a tip end of the arm 33 is disengaged from the stop projection 20*a* and the device body 10, which was locked to the stationary portion 20, is released. When the handle 31 is moved to the extended position and the device body 10 is pulled out in the direction of arrow A, the chassis 11 is removed from the stationary portion 20.

Figure 5:
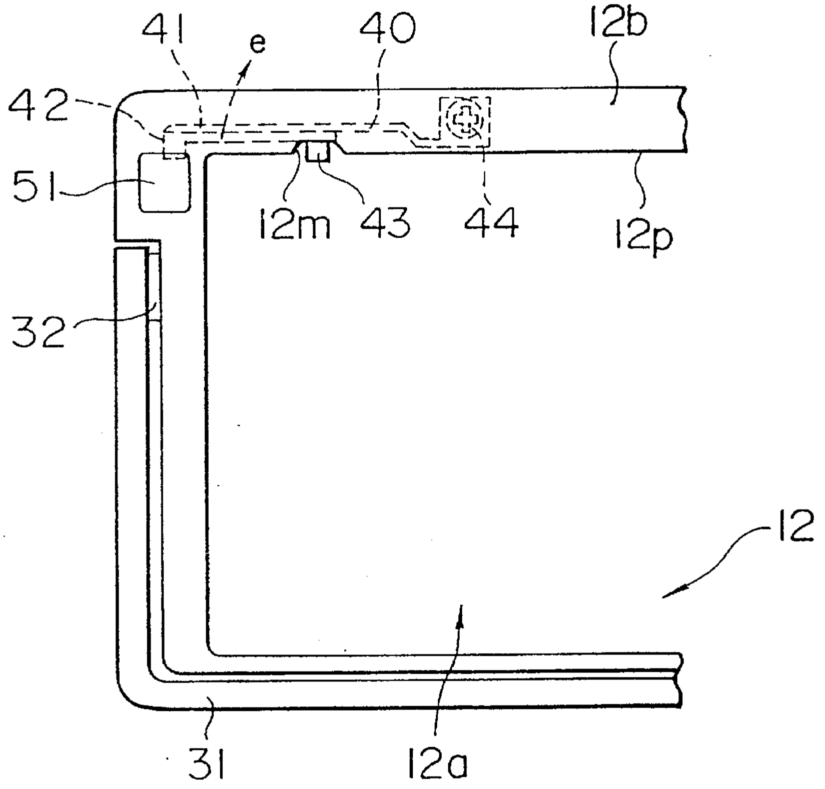
FIG. 5 is a partial front view of a nose portion provided with restraining means according to a second embodiment of the invention.
Figure 6:
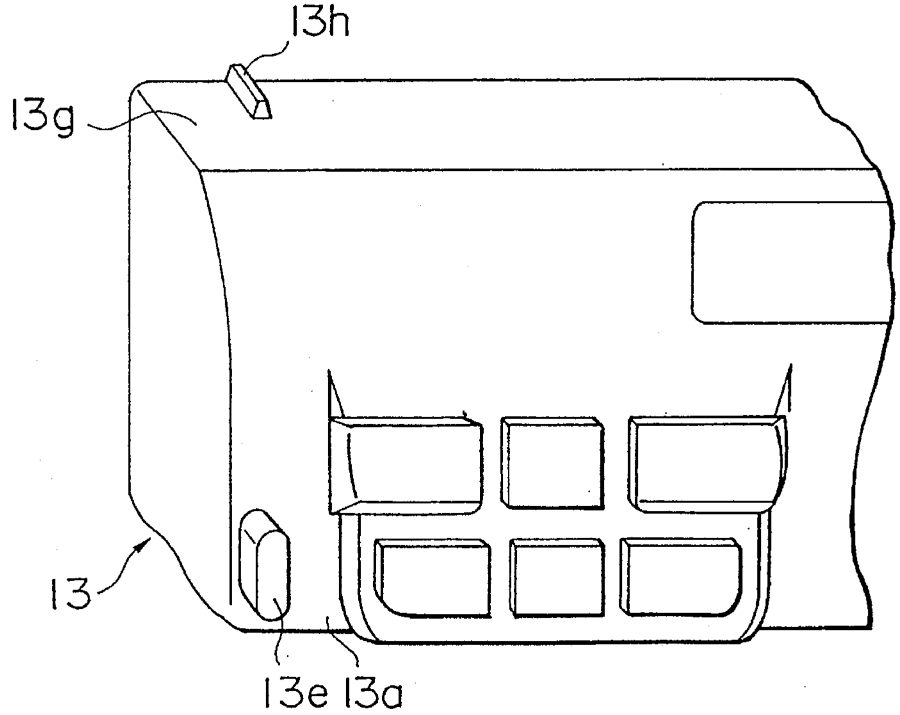
FIG. 6 is a partial perspective view of an control unit mounted in the nose portion of FIG. 5.

FIGS. 5 and 6 illustrate a second embodiment of the present invention.

In the embodiment of the invention shown in FIGS. 5 and 6, a groove 12*m* extending into the recessed portion 12*a* is formed in the bottom surface section 12*p* of the peripheral frame 12*b* of the nose portion 12, that is, in a surface portion facing the recessed portion 12*a*, as illustrated in FIG. 5. Although the fundamental structure of the restraining assembly 40 is the same as illustrated in FIG. 3, the detection projection 43 protrudes in the groove 12*m*. As shown in FIG. 6, in this embodiment of the invention, a ridge 13*h* is formed on the top surface 13*g* of the control unit 13 and extends to the rear surface thereof to be fitted to the recessed portion 12*a* of the nose portion 12. When the control unit 13 is fitted into the recessed portion 12*a* of the nose portion 12, the ridge 13*h* is inserted into the groove 12*m*. Further, the detection projection 43 is pushed by the top surface of the ridge 13*h* in the direction of the arrow (e) (See FIG. 5). Thus, the restraining assembly 42 moves away from the rear end of the push button 51 in an upward direction in FIG. 5.

As discussed above, in this embodiment the detection projection 43 is provided within the groove 12*m* formed in the bottom surface section 12*p* of the upper part of the peripheral frame 12*b* of the nose portion 12 (namely, in the surface portion facing the recessed portion 12*a*) in such a manner to protrude from the inner surface thereof. Therefore, even when the bottom surface 12*p* of the peripheral frame 12*b* is manipulated with a finger, the detection projection 43 provided in the groove 12*m* is unaccessible. Consequently, the device body 10 is even more effectively protected from theft when control unit 13 is removed.

The restraining assembly 40 of the embodiment of FIGS. 3 and 5 employs the plate spring 41 as the restraining means. Further, the restraining member 42 and the detection projection 43 are fixed to the plate spring 41. However, the restraining means of the present invention is not limited to this particular structure.

For example, in another embodiment of the invention, the restraining member 42 and the detection projection 43 are held together as a unit. In this embodiment, the restraining member 42/detection projection 43 unit is pivotally supported on a pin (not shown) serving as a fulcrum to allow rotation of the unit in the directions of arrows (d) and (e). Alternatively, the restraining member 42/detection projection 43 unit is vertically supported, as viewed in FIGS. 3 and 5. In this embodiment, the restraining member 42/detection projection 43 unit is urged or pressed in the direction of the arrow (d) or downwardly by a biasing member such as a plate spring, a coil spring or the like. Additionally, the restraining member 42 is not necessarily limited to being held against the rear end of the push button 51. Instead, a structure in which a groove is formed in the push button 51 and the restraining member 42 is fitted into this groove to thereby restrain the operation of pressing the push button 51 in the direction of the arrow C may be employed. With this embodiment of the invention the restraining assembly 40 consists of: a restraining member adapted to shift in a direction in which the restraining member can prevent the push button 51 from being pushed (or in a direction in which the restraining member is held against the push button); a biasing member for energizing or pressing the restraining member in a direction to prevent the push button from being pushed; and a detection projection adapted to protrude in an outer surface intersecting with a direction of insertion of the control unit to be inserted. Further, when the detection projection is pushed by the outer surface of the control unit to be inserted, the restraining member is shifted in a direction in which the restraining member moves away from and releases the push button.

As discussed above, in the case of the embodiment of FIGS. 5 and 6, a groove 12*m* is formed in a portion facing the outer surface of the control unit 13 when the control unit 13 is inserted in the device body 10. In the groove 12*m*, the detection projection 43 protrudes to the ridge 13*h* on control unit 13.

In an alternate embodiment, a hole, for example a cylindrical hole (not shown), which can not be seen from the front of the nose portion 12, is formed in the bottom surface part 12*p* of the peripheral frame 12*b*. The detection projection 43 is then positioned in this hole. A projection (not shown) is provided on the top surface of the control unit 13 so as to resiliently protrude therefrom. When the control unit 13 is inserted into the recessed portion 12*a* of the nose portion 12, the projection provided on the top surface of the control unit 13 touches the bottom surface 12*p* of the peripheral frame 12*b* and temporarily retracts. Thereafter, when the control unit 13 is completely fitted into the recessed portion 12*a* of the nose portion 12, in the cylindrical hole, and the projection protrudes from the inner surface thereof. Then, the detection projection 43 is pushed in the direction of the arrow (e) by the projection member protruding in the cylindrical hole. Consequently, the push button 51 is freed from the restriction imposed by the restraining member 42. In this case, instead of the detection projection 43, a release portion other than a projection pushed by a part of the control unit may be provided in the restraining assembly 40.

In this embodiment, the restraining assembly 40 consists of: a restraining member adapted to shift in a direction in which the restraining member can prevent the protruded push button 51 from being pushed (or in a direction in which the restraining member can be held against the push button); a biasing member for energizing or pressing the restraining member in the direction in which the restraining member can prevent the protruded push button 51 from being pushed; and a release portion pushed by a part of the control unit. Further, when the control unit is attached to the device body and the release portion is pushed by the part of the control unit 13, the restraining assembly is shifted in a direction in which the restraining assembly cancels the restriction imposed on the push button.

Figure 7:
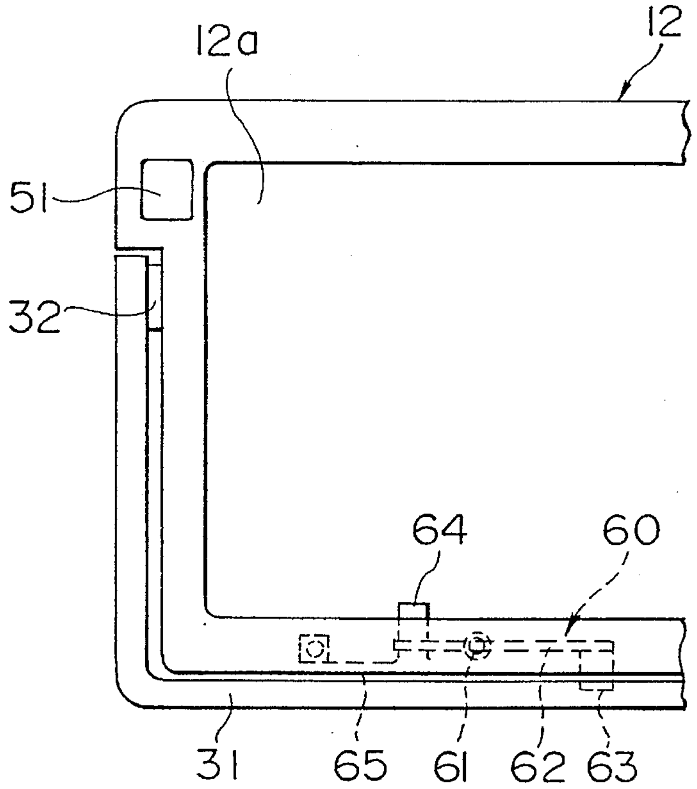
FIG. 7 is a partial front view of a nose portion having restraining means for restraining the operation of a handle according to a third embodiment of the invention.

FIG. 7 illustrates a third embodiment of the present invention.

In this embodiment, the retaining surface 33*f* of the lock arm 33 is also provided and is employed in a similar manner as in the case of the embodiment of FIG. 1 discussed above. The device body 10 is locked to the stationary portion 20 by the contact of the retaining surface 33*f* against the stop projection portion 20*a*. Further, the handle 31 is provided as the lock release means for releasing the locked state of the device body. The position of the handle 31 is restricted by a restraining assembly 60 to the down position (i.e., position (b) in FIG. 2). The restraining assembly 60 is positioned in the lower part of the peripheral frame as shown in FIG. 7. Thus when the control unit 13 is taken out of the device body 10, the handle 31 is prevented from pivotally moving to the extended position (positions (c) or (a) in FIG. 2).

A restraining member 63, which is fitted into the handle 31, prevents the handle 31 from pivotally moving to the first position. As shown in FIG. 7, restraining member 63 is positioned in the device body 10 (more particularly, the peripheral frame of the nose portion 12). The restraining member 63 is fixed to an arm 62 adapted to pivotally move around a fulcrum 61. The restraining member 63 is urged or pressed by a plate spring 65 serving as the biasing member in a direction in which the handle 31 is prevented from pivotally moving (or in a direction in which the restraining member 63 can be fitted into a hole or a recess portion formed in the handle 31, not shown).

A detection projection 64 is provided in the restraining assembly 60 in such a manner that the projection 60 is pressed by a part of the control unit when the restraining member 63 restricts the movement of the handle 31. When the control unit 13 is attached to the device body 10 (more particularly, the nose portion 12), the detection projection 64 is contacted and pressed by a part of the control unit 13. Thus, the restraining member 63 is moved in the direction in which the restriction imposed on the handle 31 is removed.

In the embodiment of FIG. 7, when the control unit 13 is detached from the device body 10, the handle 31 cannot move pivotally. Thus, the device body 10 can not be taken out of the stationary portion 20.

Moreover, in the case of the embodiment of FIG. 7, the detection projection 64 may also be placed in the groove (see groove 12*m* in FIG. 5) formed in the peripheral frame of the nose portion 12. Furthermore, the ridge 13*h*, as illustrated in FIG. 6, may be provided in the bottom surface part of the control unit 13 and thus the detection projection 64 may be held by fitting the ridge portion into the groove, as in the case of the embodiment of FIG. 5.

Alternatively, the following structure may be employed in the embodiment of FIG. 7. A hole, such as a cylindrical hole (not shown), which can not be seen from the front of the nose portion 12, can be formed in the top surface of the lower peripheral frame. The detection projection 64 is then placed in this hole. On the other hand, a projection (not shown) can be provided on the bottom surface of the control unit 13 so as to resiliently protrude therefrom. In this embodiment, the control unit 13 is inserted into the recessed portion 12*a* of the nose portion 12 and the projection provided on the bottom surface of the control unit 13 resiliently protrudes from the inner surface of the hole. Then, the detection projection 64 is pushed by the projection protruding in the cylindrical hole. Consequently, the restriction imposed by the restraining means 63 on the handle 31 is released.

Figure 8:
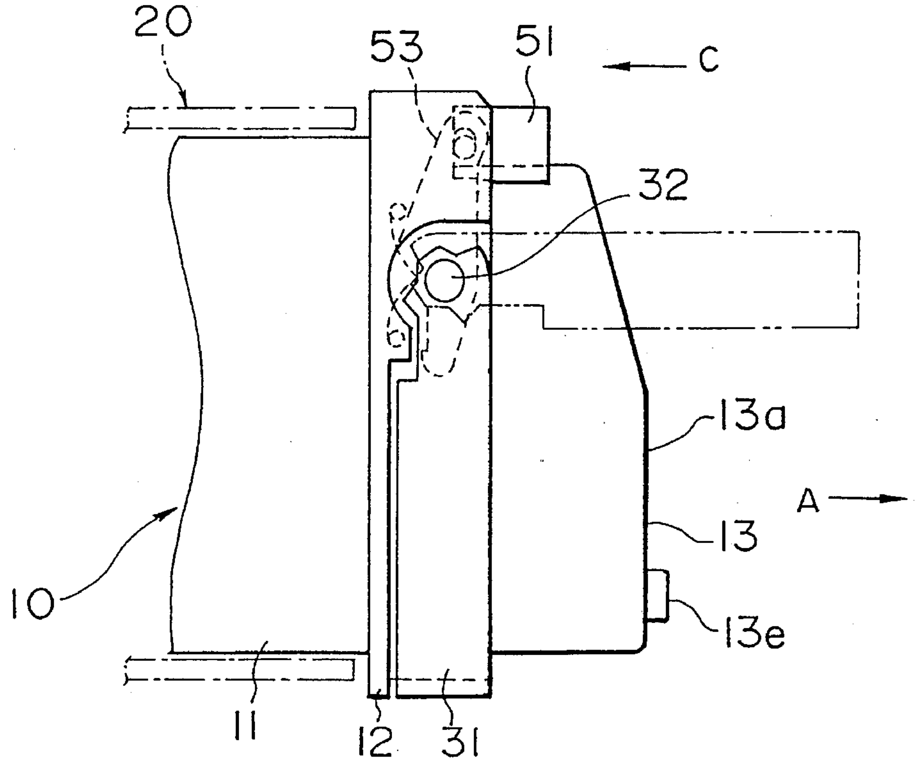
FIG. 8 is a side view of a detachable vehicle-mounted audio device on which an control unit is mounted according to a fourth embodiment of the present invention.

FIG. 8 is a side view of the vehicle-mounted type audio device which is a fourth embodiment of the present invention.

Figure 9:
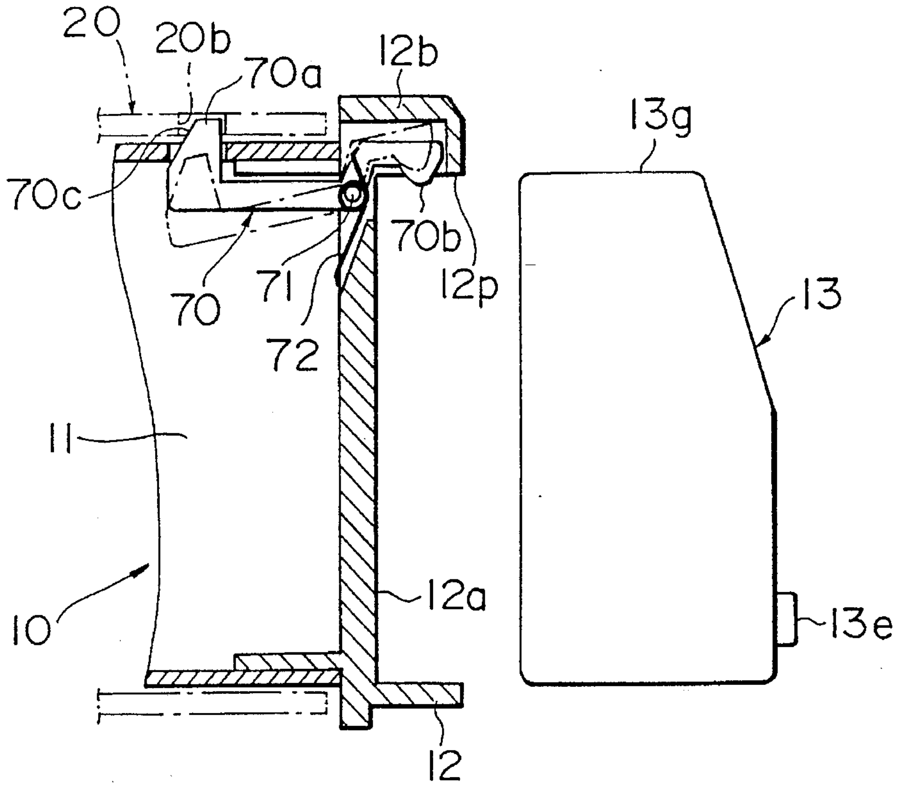
FIG. 9 is a sectional view of the detachable vehicle-mounted audio device of FIG. 8.

FIG. 9 is a sectional view of a frame, on which the control unit is mounted in the fourth embodiment of the present invention.

As illustrated in FIG. 8, in this embodiment, the handle 31 is pivotally mounted on supporting shafts 32 fixed to both of the side surfaces of the nose portion 12 of the device body 10. The push button 51 protrudes in front of the nose portion 12. When the push button 51 is pushed in the direction of the arrow C, the biasing plate 53 is pivotally moved about the supporting shafts 32 in a counterclockwise direction. Thus, the handle 31 is pivotally moved by this biasing plate 53 counterclockwise to a position where a user can easily take hold of the handle 31 i.e., an extended position.

In this embodiment, the handle 31 is not associated with either the locking of the device body 10 to the stationary portion 20 or the releasing of the device body 10 from the stationary portion 20.

As illustrated in FIG. 9, a retaining or lock lever 70, functioning as the lock means, is provided in the upper part of the inside of the device body 10. The lock lever 70 is pivotally supported on a supporting shaft 71 provided in the nose portion 12. The lock lever 70 is biased by a torsion spring 72 in the clockwise direction. A retaining or lock projection portion 70*a* is integrally formed at the left-hand end of the lock lever 70, as viewed in FIG. 9. Moreover, a retaining or lock hole 20*b*, into which the lock projection portion 70*a* is inserted for locking the device body, is formed in the stationary portion 20.

A detection projection 70*b*, serving as the detection mechanism, is integrally formed at the right end of the lock lever 70 as viewed in FIG. 9. When the lock lever 70 is moved by the torsion spring 72 pivotally and clockwise, the detection projection 70*b* protrudes from the bottom surface 12*p* of the peripheral frame 12*b* of the upper part of the nose portion 12 to the recessed portion 12*a*.

In this embodiment, if the control unit 13 is detached from the recessed portion 12*a* of the nose portion 12 provided in front of the device body 10 when the device body 10 is inserted and attached to the stationary portion 20, the lock lever 70, biased by the torsion spring 72, is pivotally moved clockwise and the lock projection portion 70*a* is fitted into the lock hole 20*b*. Thus the device body is locked to the stationary portion 20. Consequently, even when the handle 31 is pivotally moved to the position indicated by broken lines in FIG. 8 and the device body 10 is pulled, the device body 10 can not be taken out of the stationary portion 20.

When the control unit 13 is fitted into the recessed portion 12*a* of the nose portion 12, the control unit 13 is fixed or locked to the device body 10 by means of the fixing or lock mechanism 19 (see FIG. 1). When the control unit 13 is fitted into the recessed portion 12*a*, the top surface of the control unit 13 touches the detection projection 70*b*. Then, the detection projection 70*b* is pushed and the lock lever 70 is pivotally moved counterclockwise. Thus, the lock projection 70*a* moves away from the lock hole 20*b*. Consequently, the locked state of the device body, which is caused by the restraining lever 70 serving as the lock means, is released. When the control unit 13 is attached to the device body 10, the device body 10 can not be removed from the stationary portion 20.

In the case of the embodiment of FIG. 9, the following structure may be employed, similar to the structure of FIG. 5, the detection projection 70*b* can be placed in the groove 12*m* (see FIG. 5) formed in the peripheral frame of the nose portion 12. Moreover, the ridge 13*h* as illustrated in FIG. 6 can be provided on the top surface 13*g* of the control unit 13. In this embodiment, the ridge portion 13*h* is fitted into the groove 12*m* so that the detection projection 70*b* can be pushed.

Alternatively, the following structure may be also employed in the embodiment of FIG. 9. A hole such as a cylindrical hole (not shown) which can not be seen from the front of the nose portion 12, can be formed in the bottom surface part 12*p* of the lower peripheral frame of the nose portion 12. The detection projection 70*b* is placed in this hole. On the other hand, a projection can be provided on the top surface 13*g* of the control unit 13 in so as to resiliently protrude therefrom and when the control unit 13 is fitted into the recessed portion 12*a* of the nose portion 12, the projection provided on the bottom surface of the control unit 13 resiliently protrudes from the inner surface of the hole. Then, the detection projection 70*b* is pushed by the projection protruding in the hole.

Figure 10:
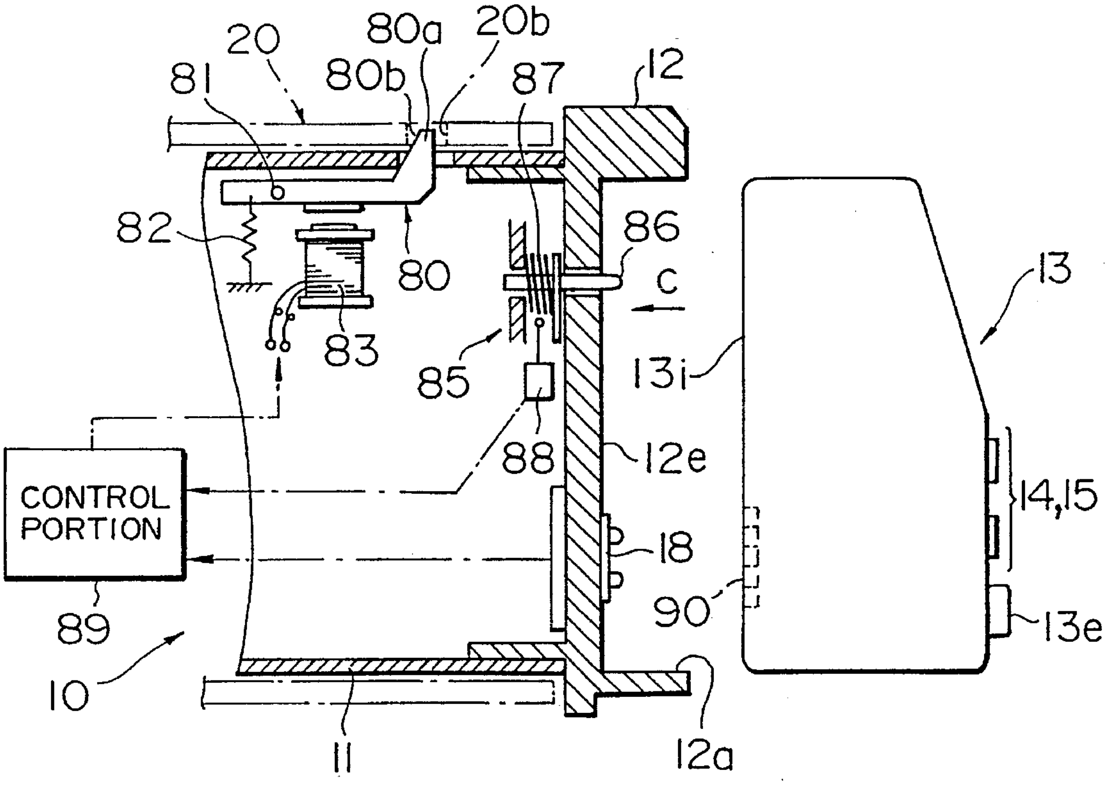
FIG. 10 is a sectional view of a detachable vehicle-mounted audio device according to a fifth embodiment of the present invention.

FIG. 10 is a sectional view of a front part or frame, on which a control unit 13 is mounted, of a vehicle-mounted audio device which is a fifth embodiment of the present invention.

The handle 31 and the push button 51 are provided in this embodiment and function as in the embodiment of FIG. 8 discussed above. The handle 31, however, is associated with neither the locking of the device body 10 to the stationary portion 20 nor the releasing of the device body 10 from the stationary portion 20.

In the embodiment of FIG. 10, a retaining or lock lever 80 made of a magnetic material is provided in the upper part of the inside of the device body 10 as the lock mechanism. The lock lever 80 is pivotally supported on a support shaft 81. A lock portion 80 is formed at the right end of the lock lever 80 and is integral with lock lever 80 as viewed in FIG. 10. Further, the lock lever 80 is biased or pressed by a torsion spring 82 clockwise. The lock portion 80*a* protrudes from the top surface of the chassis 11 by the biasing force of the torsion spring 82. Moreover, a retaining or lock hole 20*b*, to which the lock portion 80*a* is inserted, for locking the device body, is formed in the stationary portion 20.

An electromagnet (for instance, a solenoid) for supplying a driving force is provided in the chassis 11 as the lock release member. When the electromagnet 83 is activated, the lock lever 80 is attracted by the electromagnet 83, and the lock lever 80 is pivotally moved clockwise.

Further, a detection mechanism 85 for sensing whether or not the control unit 13 is fitted into the recessed portion 12*a* of the nose portion 12 is provided on the bottom surface 12*e* of the nose portion 12. The detection mechanism 85 consists of: a detection pin 86 protruding from the bottom surface 12*e*; a spring 87 for biasing or pressing the detection pin 86 so that the detection pin 86 protrudes from the bottom surface 12*e*; and an electric switch 88 for sensing whether or not the detection pin 86 moves back in the direction of arrow C (see FIG. 2).

In this embodiment, when it is detected that the control unit 13 is not attached to the device body 10, the electromagnet 83 is not activated. Thus, the lock lever 80 is not attracted by the electromagnet 83 but remains pivotally moved in the counterclockwise direction. The retaining or lock portion 80*a* of the lock lever 80, pivotally moved counterclockwise, is inserted into, and held, in the lock hole 20*b*. As a result, the device body 10 is locked to the stationary portion 20 and is unable to be removed therefrom.

The detection projection 43 (see FIG. 3) may be provided instead of the electric switch 88 so that when the detection projection 43 senses that the control unit 13 is fitted into the recessed portion 12*a* of the nose portion 12, the detection projection 43 directly controls the activation of the electromagnet 83.

If the control unit 13 is fitted into the recessed portion 12*a* of the nose portion 12 and is fixed thereto by the fixing mechanism 19 (see FIG. 1) when the device body 10 is locked to the stationary portion 20, the detection pin 86 of the detection mechanism 85 is pushed by the rear surface 13*i* of the control unit 13 in the direction of the arrow C (see FIG. 10). Thus, a contact (not shown), to which the electric switch 88 is set, is changed. A state of the electric switch 88 is monitored by a control portion 89. When the contact, to which the electric switch 88 is set, is changed, electric power is supplied from a drive power source (not shown) to the electromagnet 83 in accordance with command of the control portion 89. When the electromagnet 83 is activated, the lock lever 80 is attracted by the electromagnet 83 and is then moved pivotally and clockwise. Thus, the lock portion 80*a* moves away from the lock hole 20*b*. Consequently, the locked state of the device body is released and when handle 31 of the device body 10 is pulled, the device body 10 can be removed from the stationary portion 20.

In the case of the embodiment of FIG. 10, after the control unit 13 is fitted into the nose portion 12, when this state is detected by the electric switch 88, the electromagnet 83 is immediately activated in accordance with a command of the control portion 89 to release the locked stated of the lock lever 80. However, even when it is detected by the electric switch 88 that the control unit 13 is fitted into the nose portion, the device does not necessarily require that the electromagnet 83 be immediately activated. A pin connector 18 is provided in the nose portion 12 and a connector 90 to be connected to the pin connector 18 is provided on the back surface 13*i* of the control unit 13. Thus, when the control unit 13 is fitted into the nose portion 12, operation signals from the group of the operating buttons 14 and 15 provided in the control unit 13 can be supplied to the control portion 89 of the device body 10 and the locked state of the device body can be canceled by a command from the control unit 13.

In this embodiment, when it is detected by the electric switch 88 that the control unit 13 is fitted into the nose portion, the control portion 89 is put into a standby state in which the control portion can activate the electromagnet 83. If one of the operating buttons 14 and 15 is pushed when the control portion 89 is in this standby state, an operation signal issued from the pushed button is supplied to the control portion 89 through the connectors 90 and 18. When receiving this operation signal, the control portion 89 activates the electromagnet 83 to pivotally move the lock lever 80. Thus, the device body 10 is released from stationary portion 20.

In one embodiment the user/driver memorizes a cipher code. Then the user/driver enters this cipher code via buttons 14 and 15 and this signal causes the control portion 89 to activate the electromagnet 83 to move the lock lever 80. Thus, with this embodiment, only the user/driver can release the device body 10 from the stationary portion 20 after the control unit 13 is attached to the device body 10. Consequently, anti-theft protection is enhanced.

Figure 11:
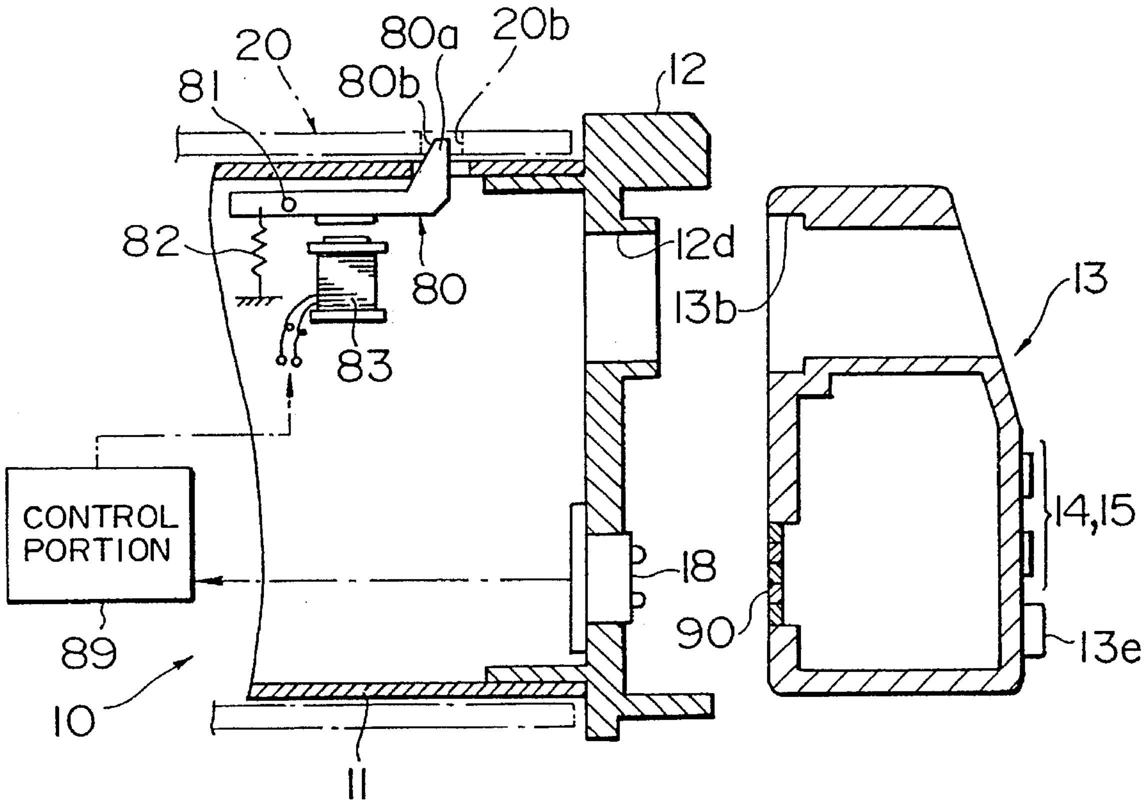
FIG. 11 is a diagram for illustrating a modification of the embodiment of FIG. 10.

FIG. 11 depicts a modification of the embodiment of FIG. 10.

In the embodiment of FIG. 11, the retaining or lock lever 80 serving as the lock means and the electromagnet 83 serving as the lock release means are the same as those illustrated in FIG. 10 and discussed above. However, in contrast to the embodiment of FIG. 10, in which the detection mechanism 85 for sensing whether or not the control unit 13 is attached to the device body 10 is provided, the detection mechanism 85 is not provided in the embodiment of FIG. 11. Instead, a part of the terminals of the pin connector 18 and the connector 90 function as the detection mechanism.

In this embodiment, when the pin connector 18 and the connector 90 are connected with each other, it is detected that the control unit 13 is attached to the device body 10. At that moment, the electromagnet 83 serving as the lock release means can be immediately activated.

Figure 12A:
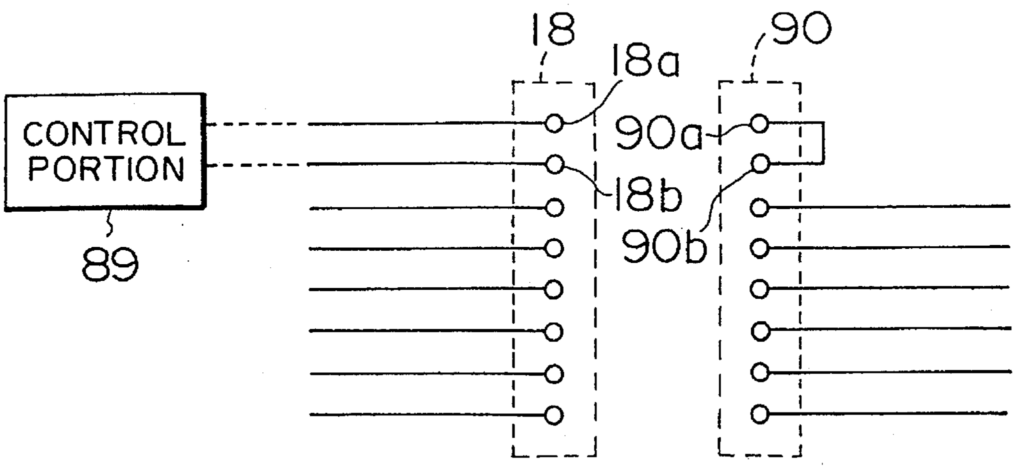
FIGS. 12A and 12B are circuit diagrams illustrating the configuration of the modification of FIG. 11 when a connector is employed as a detection mechanism.

A circuit such as illustrated in FIG. 12A can be used with this embodiment, a pair of the terminals 18*a* and 18*b* of the pin connector 18 and a pair of the terminals 90*a* and 90*b* of the connector 90 of the control unit 13 are adapted to be connected. The terminals 90*a* and 90*b* of the connector 90 are short-circuited when the pin connector 18 is connected with the connector 90 and the control portion 89 immediately senses that the control unit 13 is attached to the device body.

Figure 12B:
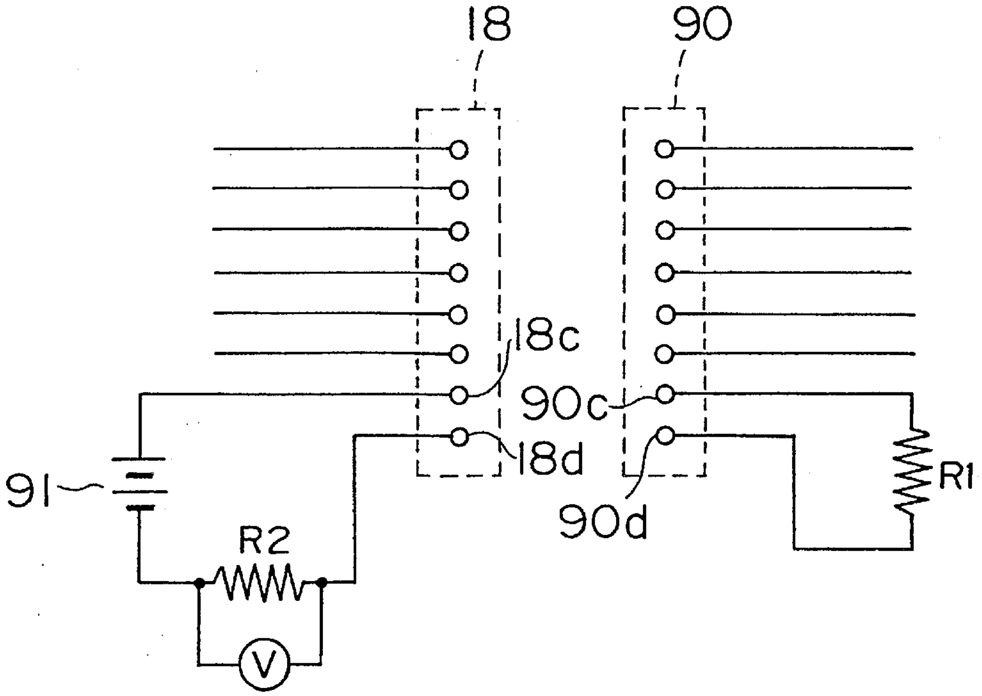
Figure 13:
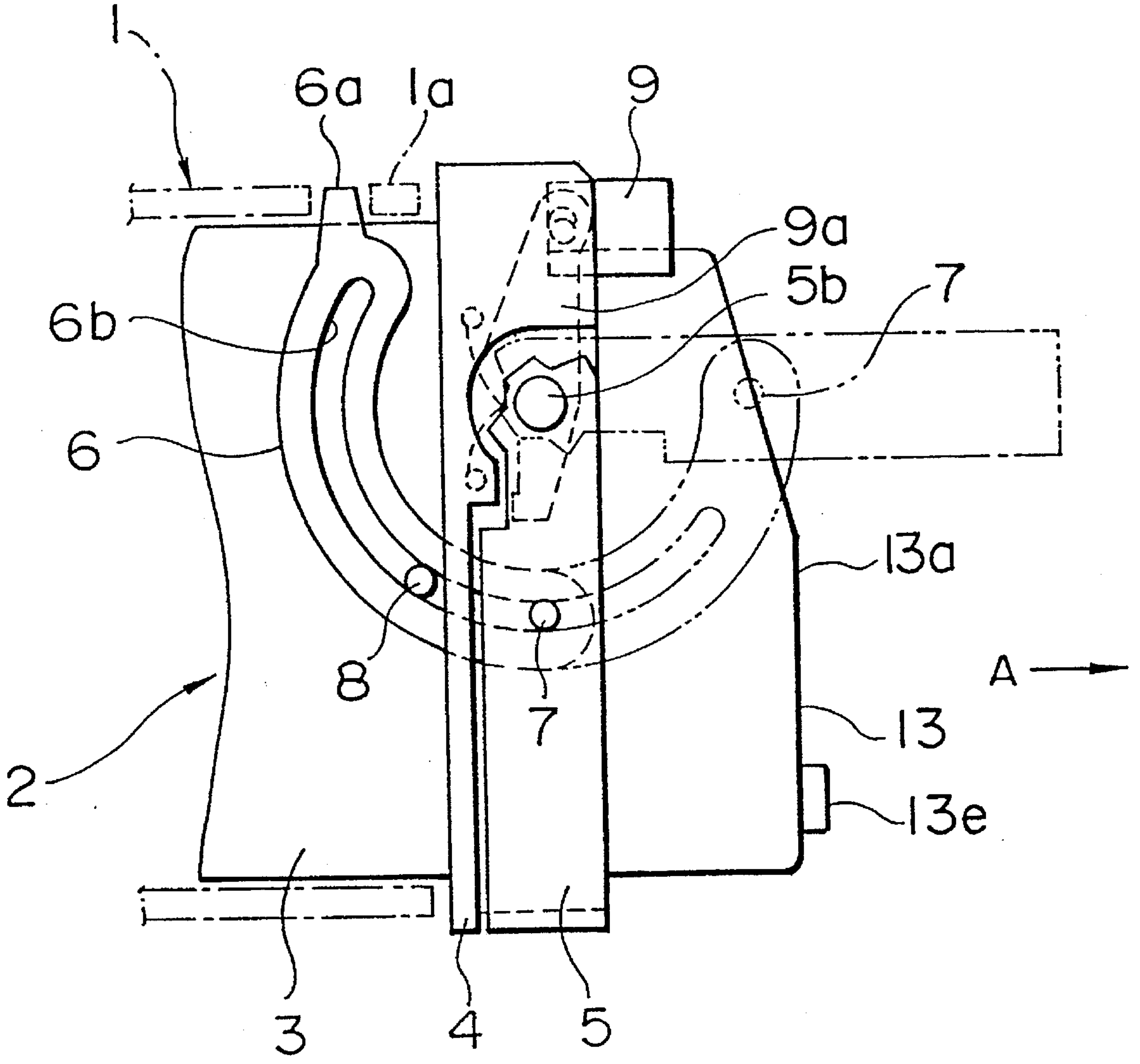
FIG. 13 (Prior Art)
FIG. 13 is a partial side view of the conventional detachable vehicle-mounted audio device.

Alternatively, in the case of a circuit as illustrated in FIG. 12B, an operation of sensing whether or not the control unit 13 is attached to the device body can be performed by using the terminals 18*c*, 18*d*, 90*c*, and 90*d* to supply electric power among the terminals of the connectors 18 and 90. A load resistance R1, which can be an illuminating lamp provided in the control unit 13, is connected to the power supply terminals 90*c* and 90*d* of the connector 90 of the control unit 13. Further, a power source 91 is connected to the power supply terminals 18*c* and 18*d* of the pin connector 18 of the device body 10. Naturally, electric current flow through a detection resistance R2 differs depending on whether or not the terminals 18*c* and 18*d* are connected with the terminals 90*c* and 90*d*, respectively. Therefore, whether or not the control unit 13 is attached to the device body can be immediately detected by the control portion 89 by supplying the terminals 18*c* and 18*d* with an extremely small electric current to be used for the detection, and monitoring the voltage developed across and the current flowing through the detection resistance R2.

In case where the circuits of FIG. 12A or 12B are used instead of the detection mechanism 85 of FIG. 10, when the control unit 13 is attached to the device body 10, this is detected by the control portion 89. At that time, the electromagnet 83 is immediately activated, so that the electromagnet retaining or lock lever 80 is attracted by the electromagnet 83 and the device body 10 is released from the stationary portion 20. Thus, when the control unit 13 is attached to the device body 10, it becomes possible to remove the device body 10 from the stationary portion 20.

Further, the following control operation can be achieved by utilizing the connection between the pin connector 18 and the connector 90. When the pin connector 18 is connected to the connector 90, the detection operation discussed above with respect to FIG. 12 is not performed. Instead, when the pin connector 18 and the connector 90 are connected with each other, it is simply assumed that the control unit 13 is in a "detection state" (namely, a connected state) in which the control unit 13 is attached to the device body 10. Then, the operating body of one of the operating buttons 14 and 15 provided on the control unit 13 is pushed. When a signal issued from the pushed button 14 or 15 is in-putted to the control portion 89 through the connectors 18 and 90, the electromagnet 83 is activated. As a result, the lock lever 80 is attracted by the electromagnet 83. Consequently, the device body 10 is released from the stationary portion 20. In this case a user also memorizes a cipher code and enters it by pushing one or more of the operating buttons 14 and 15. When the operating buttons required by the cipher code are pushed, the control portion 89 releases the device body 10 from the stationary portion 20. Thus, the anti-theft protection is enhanced and, moreover, with this system it is not necessary to provide the detection mechanism of FIG. 10.

Therefore, the structure of the device body 10 can be simplified.

Additionally, with the retaining or lock levers 70 and 80 of FIGS. 9, 10 and 11, the edge portions of the retaining or lock projection portions 70*a* and 80*a* extending in the direction of the arrow C (FIG. 2) are shaped as inclines 70*c* and 80*b*. Thus, when the device body 10 is inserted into the stationary portion 20, the incline 70*c* or 80*b* touches the end surface of the stationary portion 20. Then, the lock projection portion 70*a* or 80*b* moves into the chassis 11. Thereafter, when the device body 10 is securely attached to the stationary portion 20 and the lock projection portion 70*a* or 80*b* is fitted into the lock hole 20*b*.

The techniques of the detachable electronic device of the present invention can be applied to, for instance, a vehicle-mounted audio device, a shipboard audio device and other devices for use in a navigation system.

As described above, according to the present invention, when the control unit is detached from the device body, the device body is locked to the stationary portion and cannot be released therefrom. Therefore, the present invention solves the problem presented when the control unit is detached from the device body but the device body could still be detached and stolen from the stationary portion.

Although the preferred embodiments of the present invention have been described above, it should be understood that the present invention is not limited thereto and that other modifications will be apparent to those skilled in the art without departing from the spirit of the invention.

The scope of the present invention, therefore, should be determined solely by the appended claims.

What is claimed is:

1. A detachable electronic device comprising:

a stationary portion having an opening;

a device body insertable into the opening of the stationary portion;

a control unit removably attached to the device body;

a lock member which is mounted on the device body, the lock member being movable between a locked position and a released position, wherein the lock member engages with the stationary portion when the device body is inserted into the stationary portion and the lock member is in the locked position, thereby fixedly connecting the device body to the stationary portion;

a lock release mechanism including a lock release member which is movable between first and second positions, wherein the lock release mechanism is connected to the lock member such that the lock member is moved from the locked position to the released position when the lock release member is moved from the first position to the second position; and a lock release prevention mechanism mounted on the device body, the lock release prevention mechanism including a restraining member which is movable between a third position and a fourth position;

wherein, when the restraining member is in the third position, the restraining member engages the lock release mechanism to prevent movement of the lock release member from the first position to the second position;

wherein, when the restraining member is in the fourth position, the restraining member is separated from the lock release mechanism; and wherein the restraining member is biased into the third position when the control unit is separated from the device body, and the restraining member is biased into the fourth position when the control unit is attached to the device body.

2. The detachable electronic device according to claim 1, wherein the lock release member comprises a handle pivotally connected to the device body and connected to the lock member such that, when the handle is in the first position, the lock member is in the locked position, and when the handle is in the second position, the lock member is in the released position.

3. The detachable electronic device according to claim 2, wherein the lock member includes an arm having a fixed end connected to the handle and a free end including a retaining surface; and wherein the stationary portion includes a stop projection which is positioned such that, when the device body is inserted in the stationary portion and the handle is in the first position, the stop projection is positioned between the retaining surface of the arm and the device body, thereby preventing the device body from being detached from the stationary portion.

4. The detachable electronic device according to claim 3, wherein the lock release prevention mechanism further comprises:

an elongated member having a first end fixedly connected to the device body, and a free end including the restraining member; and a detection projection extending from the elongated member, the detection projection being positioned such that, when the control unit is mounted on the device body, the detection projection is contacted by the control unit, thereby moving the lock release member to the second position.

5. The detachable electronic device according to claim 4, wherein a recessed portion is provided in a front portion of the device body for receiving the control unit, and the detection projection protrudes into the recessed portion.

6. The detachable electronic device according to claim 5, wherein the elongated member is formed from a resilient material and biases the detection projection into the recessed portion.

7. The detachable electronic device according to claim 1, wherein the lock release mechanism further comprises a push button slidably mounted on the device body, the push button being connected to the lock release member such that the lock release member is moved from the first position to the second position upon manual depression of the push button, wherein, when the restraining member is in the third position, the restraining member engages the push button, thereby preventing the push button from being depressed, wherein the lock member includes a retaining surface which engages a stop projection formed on the stationary portion, thereby preventing the device body from being detached from the stationary portion, and wherein the lock release member includes a handle which is pivotally connected to the device body, the handle disengaging the retaining surface from the stop projection when the handle is pivoted from the first position to the second position, and wherein the lock release prevention mechanism includes a detection projection connected to the restraining member whereby when the control unit is attached to the device body, the detection projection contacts the control unit such that the restraining member is moved into the second position, wherein, when the push button is depressed, the push button pivots the handle away from the first position.

8. The detachable electronic device according to claim 7, wherein the lock release preventing mechanism includes a plate spring having the restraining member and the detection projection mounted thereon, and wherein when the detection projection is contacted by the control unit, the plate spring is elastically deformed such that the restraining member is moved into the fourth position.

9. The detachable electronic device according to claim 1, wherein the lock member includes a retaining surface which engages a stop projection formed on the stationary portion, thereby preventing the device body from being detached from the stationary portion, wherein the lock release mechanism includes an electro-mechanical device connected to the restraining member, and a detection device for detecting that the control unit is mounted on the device body, the electro-mechanical device being actuated to move the restraining member from the third position to the fourth position when the detection device detects that the control unit is mounted on the device body.

10. The detachable electronic device according to claim 9, wherein the detection device electrically detects that the control unit is mounted on the device body.

11. The detachable electronic device according to claim 9, further comprising:

a control portion coupled to the detection device, wherein the electro-mechanical device is a solenoid and the detection device is an electric switch, and further wherein a state of the electric switch is monitored by the control portion, and when the control unit is attached to the device body the state of the electric switch changes and the control portion drives the solenoid, thereby moving the restraining member from the third position to the fourth position.

12. The detachable electronic device according to claim 9, wherein a plurality of connectors are provided between the device body and the control unit for transmitting control signals from the control unit to the device body, and wherein the detection projection comprises at least one of the plurality of connectors.

13. A detachable electronic device comprising:

a stationary portion having an opening;

a device body insertable into the opening of the stationary portion;

a control unit removably attached to the device body;

a retaining lever mounted on the device body, the retaining lever being movable between a locked position and a released position, wherein when the device body is inserted in the stationary portion and the retaining lever is in the locked position, the retaining member engages the stationary portion such that the device body is prevented from being detached from the stationary portion;

a lock release mechanism including a lock release member which is movable between first and second positions, wherein the lock release mechanism is connected to the retaining lever such that the retaining lever is moved from the locked position to the released position when the lock release member is moved from the first position to the second position; and a detection mechanism for detecting when the control unit is attached to the device body, the detection mechanism including a restraining member which engages the lock release member to prevent movement of the lock release member from the first position to the second position unless the detection mechanism detects that the control unit is attached to the device body.

14. The detachable electronic device according to claim 13, wherein the detection mechanism includes a detection projection which contacts the control unit when the control unit is attached to the device body.

15. The detachable electronic device according to claim 16 wherein the retaining lever is integrally formed with the detection projection.

16. The detachable electronic device according to claim 13, wherein the lock release mechanism includes an electro-mechanical device connected to the restraining member, wherein the detection mechanism includes a detection projection which is contacted by the control unit when the control unit is attached to the device body, and wherein when the detection projection is contacted by the control unit, the electro-mechanical device is actuated to disengage the retaining lever from the stationary portion.

17. The detachable electronic device according to claim 16, wherein a plurality of connectors are provided which electrically connect the device body to the control unit when the control unit is mounted on the device body, and the detection projection comprises at least one of the plurality of connectors.

18. A detachable electronic device comprising:

a stationary portion;

a device body attachable to the stationary portion;

a control unit attachable to the device body;

a lock mechanism for locking the device body to the stationary portion when the device body is attached to the stationary portion and the lock mechanism is adjusted into a locked state;

means for engaging the lock mechanism when the control unit is detached from the device body such that the lock mechanism is maintained in the locked state until the control unit is subsequently attached to the device body.

19. In an electronic device including a stationary portion, a device body attachable to the stationary portion, a lock mechanism for locking the device body to the stationary portion, the lock mechanism being adjustable between a released state and a locked state, and a control unit attachable to the device body, a method for preventing the device body from being detached from the stationary portion when the control unit is detached from the device body, the method comprising the steps of:

detecting that the control unit is detached from the device body; and upon detection of separation of the control unit from the device body, engaging the lock mechanism such that adjustment of the lock mechanism from the locked state to the released state is prevented.

* * * * *